United States Patent [19]

Kamata

[11] 4,342,046
[45] Jul. 27, 1982

[54] CONTACT SCREEN FOR MAKING COLOR SEPARATION HALFTONE BLOCKS

[75] Inventor: Keiichiro Kamata, Joyo, Japan

[73] Assignee: Dainippon Screen Seizo Kabushiki Kaisha, Kyoto, Japan

[21] Appl. No.: 177,476

[22] Filed: Aug. 12, 1980

[30] Foreign Application Priority Data

Aug. 21, 1979 [JP] Japan .......................... 54-114024[U]

[51] Int. Cl.³ .............................................. H04N 1/46
[52] U.S. Cl. ...................................... 358/75; 350/317
[58] Field of Search .................. 358/75; 350/311, 316, 350/317

[56] References Cited

U.S. PATENT DOCUMENTS 2,428,945 10/1947 Singer .................................. 358/75
4,151,555 4/1979 Burnett ................................ 358/75

*Primary Examiner*—Richard Murray
*Attorney, Agent, or Firm*—Marvin H. Kleinberg

[57] ABSTRACT

A contact screen for making color separation halftone blocks, for use in a picture reproducing machine, wherein a plurality of halftone screens having different screen angles are arranged on a base film in the corresponding positions to color separation reproduction pictures to be reproduced on the base film, and wherein transparent blank spaces are formed between the two adjacent halftone screens.

5 Claims, 5 Drawing Figures

FIG.

CONTACT SCREEN FOR MAKING COLOR SEPARATION HALFTONE BLOCKS

BACKGROUND OF THE INVENTION

This invention relates to a contact screen for making color separation halftone blocks, for use in a picture reproducing machine such as a color scanner.

In a color scanner, as is well-known, an original picture mounted to a picture cylinder is scanned photoelectrically by a picture scanning head to obtain color separation picture signals which are to be stored in parallel in a memory, and then by using the color separation picture signals read out of the memory in series, color separation reproduction pictures are recorded by a recording head on a photosensitive material mounted to a recording cylinder. For example, Japanese Patent Publication No. 52-18601, titled "A color separation reproduction picture recording method", has been filed by the same applicant and assignee as the present invention.

In FIG. 1 there is shown a color scanner including picture cylinder 1 on which an original picture 2 is mounted, and a recording cylinder 3 on which a photosensitive material 4 is mounted. Color separation reproduction pictures 5K, 5M, 5C and 5Y for black, magenta, cyan and yellow colors are recorded on the photosensitive material 4, as described above.

A contact screen comprising four halftone screens, each having a different screen angle, which are coupled to one another in series, to reproduce the color separation reproduction pictures in the color scanner, has been disclosed and claimed in a filed Japanese Utility Model Laying-Open Specification No. 49-128114 (Japanese Utility Model Application No. 48-25774) by the same applicant and assignee as the present invention.

In FIG. 2 is shown such a contact screen 6 which is rolled onto the photosensitive material 4 which is mounted to the recording cylinder 3 of FIG. 1, and comprises four halftone screens 7K, 7M, 7C and 7Y having screen angles of 45°, 15°, 75° and 0°, respectively, for black, magenta, cyan and yellow colors, which are connected in a row.

This contact screen 6 is conveniently used in a color scanner having a similar construction to the one shown in FIG. 1. However, in order to improve the operational functions, a conventional color scanner is provided with a function which is capable of projecting register marks, together with the color separation reproduction pictures. The register marks are used for positioning the color separation films or blocks when a color reproduction picture is reproduced.

For example, in FIG. 3 there is shown a recording photosensitive material 8 on which the color separation reproduction pictures 9 are to be recorded. Lattice-shape images 10 are recorded on the photosensitive material 8 in its blank spaces above, below and between the color separation reproduction pictures 9. The lattice-shape images 10 comprise transverse and longitudinal register lines crossing one another, and are used as register marks. This is disclosed in Japanese Patent Laying-Open Specification No. 54-46602, or Japanese Patent Application No. 52-113046, which has been filed by the same applicant and assignee as the present invention.

If the color separation reproduction pictures and the lattice-shape register lines shown in FIG. 3 are recorded simultaneously on the photosensitive material by projection through the contact screen shown in FIG. 2, the register lines thus recorded will be in the form of the halftone "dots". Since the images are broken up through the contact screen, the recorded images will involve jagged or rugged edges in their outlines. What is worse, since the screen angle of each reproduction picture is different, the jagged or rugged edges of the register lines are in disorder.

Register lines should be recorded in straight, solid lines. When register lines having the jagged or rugged edges are used, the accuracy of the positioning of the picture films is deteriorated. In particular, in an automatic positioning machine for picture films which operates by detecting photoelectrically register marks formed thereon, the register marks should be straight solid lines. If the optical resolution is high, it becomes extremely difficult to register lines which are comprised of halftone dots.

SUMMARY OF THE INVENTION

Therefore, it is an object of the present invention to provide a contact screen for making color separation halftone blocks for use in a picture reproducing machine, which is free from the above described disadvantages, and which is simple and reliable.

According to the present invention there is provided a contact screen for making color separation halftone blocks, for use in a picture reproducing machine, comprising (a) a plurality of halftone screens having different screen angles, which are arranged on a base film in positions corresponding to color separation reproduction pictures to be reproduced, and (b) transparent blank spaces formed between the adjacent halftone screens through which register lines can be recorded.

BRIEF DESCRIPTION OF DRAWINGS

In order that the present invention may be better understood, preferred embodiments thereof will now be described with reference to the accompanying drawings, in which:

FIG. 5 is a top plan view of another embodiment of a contact screen according to the present invention.

DESCRIPTION OF PREFERRED EMBODIMENTS

Figure 1:
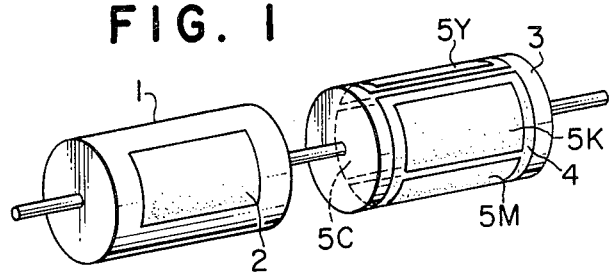
FIG. 1 is a perspective view of picture and recording cylinders of a conventional color scanner, on which an original picture and a photosensitive material are mounted.
Figure 2:
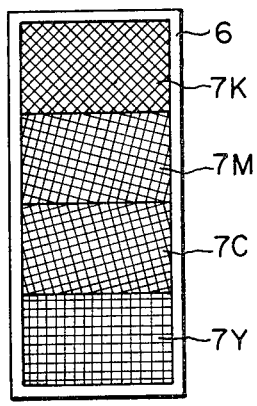
FIG. 2 is a top plan view of a conventional contact screen for making halftone blocks.
Figure 4:
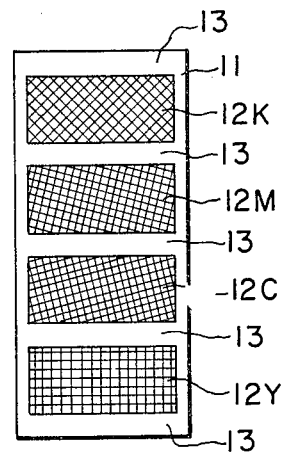
FIG. 4 is a top plan view of one embodiment of a contact screen according to the present invention.

Referring to the drawings, there is shown in FIG. 4 one embodiment of a contact screen according to the present invention, comprising four halftone screens 12K, 12M, 12C and 12Y having screen angles 45°, 15°, 75° and 0° for black, magenta, cyan and yellow colors, respectively, and which are aligned in series at a certain distance away from one another on a transparent base film 11. The halftone screen 12K, 12M, 12C and 12Y and transparent blank spaces 13 therebetween of the film 11 may be overlapped to the color separation reproduction pictures 9 and the lattice-shape register lines 10 in FIG. 3, respectively to print the various halftone blocks on the underlying photo sensitive medium.

Figure 3:
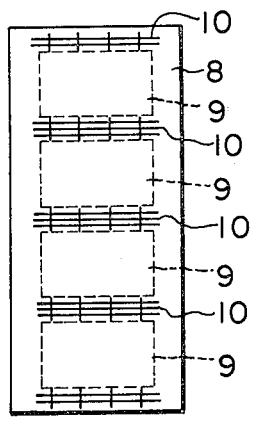
FIG. 3 is a top plan view of lattice-shape register lines which are recorded on a photosensitive material and which are used with a contact screen according to the present invention.
Figure 3:
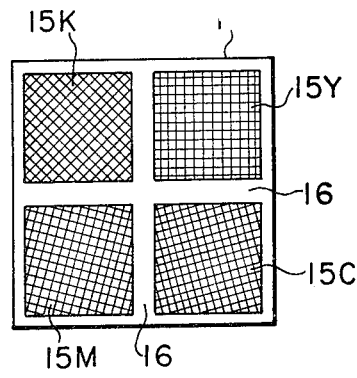

In this embodiment, when the color separation reproduction pictures 9 and the lattice-shape register lines 10 in FIG. 3 are recorded on the photosensitive material by using the contact screen shown in FIG. 4, the desired halftone reproduction pictures are produced and the lattice-shape register lines are recorded in the form of straight solid lines. The color separation images are reproduced through the halftone screens 12K, 12M, 12C and 12Y and the register marks 10 are reproduced through the transparent blank spaces 13.

In FIG. 5 there is shown another embodiment of a contact screen according to the present invention. In this case, two pairs of halftone screens 15K, 15M, 15C and 15Y, (which are the same ones as screens 12K, 12M, 12C and 12Y, of FIG. 4), are arranged in rows on a transparent base film 14. Each halftone screen is separated by a certain predetermined distance from the other adjacent halftone screens. Thus, transparent blank spaces 16 are formed between the two adjacent halftone screens in the shape of a cross. In this embodiment, the lattice-shape register lines are projected to be positioned wholly within the transparent cross-shape blank spaces 16.

Without departing from the present invention, of course, the base film may be an opaque sheet except for the transparent blank spaces. The transparency of the transparent blank spaces 13 and 16 is preferably in a range of 0.3–1.0 in order to prevent fog phenomenon when shielding of the light in the machine is imperfect. The transparency is more preferably 0.5. When the contact screens of FIGS. 4 and 5 are created photographically, the transparent blank spaces 13 and 16 are made readily by masking the corresponding portions with opaque masks.

Although the present invention has been shown and described in terms of preferred embodiments thereof, however, various changes and modifications can be made by those skilled in the art without departing from the scope of the present invention. For example, two, three, five, or more halftone screens may be arranged on a base film in the same manner as described above.

What is claimed is:

1. A contact screen for making color separation halftone blocks, for use in a picture reproducing machine, comprising:
   (a) a plurality of halftone screens having different screen angles, which are arranged on a base film in the positions corresponding to color separation reproduction pictures to be reproduced; and
   (b) transparent blank spaces formed between the two adjacent halftone screens through which register mark images are to be reproduced.

2. A contact screen defined in claim 1, wherein three halftone screens are arranged in series.

3. A contact screen defined in claim 1, wherein four halftone screens are arranged in series.

4. A contact screen defined in claim 1, wherein two pairs of halftone screens are arranged in rows.

5. A contact screen defined in claim 1, wherein five halftone screens are arranged in series.

* * * * *